US011770910B2

(12) United States Patent
Cams et al.

(10) Patent No.: US 11,770,910 B2
(45) Date of Patent: Sep. 26, 2023

(54) TELECOMMUNICATIONS ENCLOSURE WITH MODULAR LOCKING SYSTEM

(71) Applicant: COMMSCOPE TECHNOLOGIES LLC, Hickory, NC (US)

(72) Inventors: Eddy Luc Cams, Bilzen (BE); Roel Modest Willy Bryon, Kessel-Lo (BE); Philippe Coenegracht, Hasselt (BE); Johan Geens, Bunsbeek (BE); Barry Wayne Allen, Siler City, NC (US)

(73) Assignee: CommScope Technologies LLC, Hickory, NC (US)

( * ) Notice: Subject to any disclaimer, the term of this patent is extended or adjusted under 35 U.S.C. 154(b) by 131 days.

(21) Appl. No.: 17/050,236

(22) PCT Filed: Apr. 18, 2019

(86) PCT No.: PCT/US2019/028052
§ 371 (c)(1),
(2) Date: Oct. 23, 2020

(87) PCT Pub. No.: WO2019/209613
PCT Pub. Date: Oct. 31, 2019

(65) Prior Publication Data
US 2021/0084781 A1 Mar. 18, 2021

Related U.S. Application Data

(60) Provisional application No. 62/661,204, filed on Apr. 23, 2018.

(51) Int. Cl.
H05K 5/00 (2006.01)
H05K 5/02 (2006.01)
H05K 7/18 (2006.01)

(52) U.S. Cl.
CPC .......... *H05K 5/0221* (2013.01); *H05K 7/186* (2013.01)

(58) Field of Classification Search
CPC ...... H05K 5/0021; H05K 7/186; E05B 65/00; E05B 65/0057; E05B 65/0089;
(Continued)

(56) References Cited

U.S. PATENT DOCUMENTS 4,800,588 A * 1/1989 Poster, Jr. .............. H04Q 1/028
D13/184
5,245,507 A * 9/1993 Ericksen .............. A01G 27/003
174/67

(Continued)

FOREIGN PATENT DOCUMENTS

CN 201004358 Y 1/2008
CN 102204049 A 9/2011
(Continued)

OTHER PUBLICATIONS

Extended European Search Report for European Patent Application No. 19791694.3 dated Dec. 10, 2021, 10 pages.
(Continued)

*Primary Examiner* — Janet M Wilkens
(74) *Attorney, Agent, or Firm* — Merchant & Gould P.C.

(57) ABSTRACT

The present disclosure relates to telecommunications enclosures that can be customizable to meet customer needs. A telecommunications enclosure can be customized to included added security as desired. That is, a modular security lock may be utilized as an add-on feature for telecommunications enclosures.

22 Claims, 19 Drawing Sheets

(58) Field of Classification Search
CPC ...... E05B 65/0092; E05B 65/48; E05B 65/52;
E05B 65/5207; E05B 65/5246; E05B
65/5269; E05B 65/5276; E05B 65/5284;
E05B 35/008; E05C 3/00; E05C 3/006;
E05C 3/008; E05C 3/02; E05C 3/04;
E05C 3/047; E05C 3/048; Y10T
292/1083; Y10T 292/1084; Y10T
292/1085; Y10T 292/1092; Y10T 292/20;
Y10T 292/202; Y10T 292/31; Y10T
292/314; Y10T 292/319; Y10T 292/331;
Y10T 292/48; Y10T 292/4945; Y10T
292/495; Y10T 292/496; Y10T 292/51
USPC ........ 312/7.1, 223.1, 100, 215, 222; 174/50;
385/135; 361/641
See application file for complete search history.

(56) References Cited

U.S. PATENT DOCUMENTS

| | | | | |
|---|---|---|---|---|
| 5,275,029 | A * | 1/1994 | Myers | E05B 35/008 70/DIG. 79 |
| 5,710,392 | A | 1/1998 | Bordwell et al. | |
| 5,860,302 | A * | 1/1999 | James | E05C 19/06 70/168 |
| 6,158,832 | A * | 12/2000 | Costa | H04Q 1/10 411/401 |
| 6,621,975 | B2 * | 9/2003 | Laporte | G02B 6/445 385/135 |
| 6,661,961 | B1 * | 12/2003 | Allen | G02B 6/3831 385/135 |
| 6,721,484 | B1 * | 4/2004 | Blankenship | G02B 6/445 385/135 |
| 6,815,612 | B2 * | 11/2004 | Bloodworth | H02G 3/14 174/58 |
| 6,990,192 | B1 * | 1/2006 | Denovich | H02G 3/081 379/397 |
| 7,523,912 | B1 * | 4/2009 | Woods | E01F 9/681 40/606.15 |
| 10,509,187 | B2 * | 12/2019 | Carapella | H02G 3/083 |
| 2004/0114326 | A1 | 6/2004 | Dodgen et al. | |
| 2006/0153362 | A1 * | 7/2006 | Bloodworth | H02G 3/08 379/413.02 |
| 2006/0153516 | A1 | 7/2006 | Napiorkowski et al. | |
| 2008/0131132 | A1 * | 6/2008 | Solheid | G02B 6/4452 398/117 |
| 2014/0023334 | A1 * | 1/2014 | Larsson | G02B 6/4446 385/135 |
| 2015/0181749 | A1 | 6/2015 | Gong | |
| 2015/0282349 | A1 | 10/2015 | Mann et al. | |
| 2016/0091682 | A1 * | 3/2016 | Wakileh | G02B 6/4452 439/529 |
| 2016/0252694 | A1 | 9/2016 | Sadasivan et al. | |
| 2018/0310421 | A1 * | 10/2018 | Kato | H05K 5/0017 |
| 2021/0119424 | A1 * | 4/2021 | Coenegracht | G02B 6/445 |
| 2022/0397734 | A1 * | 12/2022 | Geens | G02B 6/4452 |

FOREIGN PATENT DOCUMENTS

| | | | |
|---|---|---|---|
| CN | 202815047 U | | 3/2013 |
| CN | 203473486 U | | 3/2014 |
| CN | 104731278 A | | 6/2015 |
| CN | 204403727 U | | 6/2015 |
| EP | 3330460 | * | 6/2018 |
| FR | 2715428 | * | 7/1995 |
| GB | 2259744 | * | 3/1993 |
| JP | H10-313181 A | | 11/1998 |
| KR | 20-1996-0010730 Y1 | | 12/1996 |
| WO | 2017/045049 | * | 3/2017 |
| WO | 2018/034870 A1 | | 2/2018 |
| WO | 2018205268 | * | 11/2018 |
| WO | 2019/160995 A1 | | 8/2019 |
| WO | 2019209613 | * | 10/2019 |

OTHER PUBLICATIONS

First Chinese Office Action for Chinese Patent Application No. 201980027827.2 dated May 28, 2021, 14 pages.
Second Chinese Office Action for Chinese Patent Application No. 201980027827.2 dated Dec. 3, 2021, 13 pages.
International Search Report and Written Opinion of the International Searching Authority for International Patent Application No. PCT/US2019/028052 dated Aug. 21, 2019, 8 pages.

* cited by examiner

TELECOMMUNICATIONS ENCLOSURE WITH MODULAR LOCKING SYSTEM

CROSS-REFERENCE TO RELATED APPLICATION

This application is a National Stage Application of PCT/US2019/028052, filed on Apr. 18, 2019, which claims the benefit of U.S. Patent Application Ser. No. 62/661,204, filed on Apr. 23, 2018, the disclosures of which are incorporated herein by reference in their entireties. To the extent appropriate, a claim of priority is made to each of the above disclosed applications.

TECHNICAL FIELD

The present disclosure relates generally to telecommunications enclosures. More specifically, the present disclosure relates to advantageous add-on features usable with telecommunications enclosures.

BACKGROUND

In many traditional communications networks, fiber optic cables have been used to carry data long distances between telecommunication company installations. In such traditional communications networks, other types of cables, such as copper wire loops and coaxial cables, have been used to carry data from telecommunication company installations to homes and businesses. Recently, there has been a movement to extend the fiber optic portion of the communications networks closer to homes and businesses. In some circumstances, the fiber optic portions of the communications networks extend into to the homes and businesses themselves.

Extending the fiber optic portion of a communications network closer to homes and businesses has necessitated the deployment of telecommunication enclosures. The telecommunication enclosure can be designed to facilitate splicing and termination of one or more fiber optic cables. A typical telecommunication enclosure has a set of cable entry ports through which fiber optic cables enter the telecommunication enclosure. One or more of the cable entry ports may accommodate "feeder" cables that connect to upstream points, such as telecommunication company installations, in a communications network. One or more of the other cable entry ports may accommodate "drop" cables that connect to downstream points in the communications network, such as homes and businesses.

Depending on the communication network architecture, the telecommunication enclosure may be a buried closure, an aerial closure or terminal, a fiber distribution hub or an optical network terminal.

In certain networks, there may be a need to limit access to the interior of the telecommunications enclosure. There is a need for an improved telecommunications enclosure having improved security capabilities.

SUMMARY

Aspects of the present disclosure relate to a customizable enclosure. In certain examples, it is desirable to have an enclosure with added security to prevent access to an interior of the enclosure. In certain examples, added security is not needed on the enclosure. Rather than requiring two separate enclosure types, with and without a security lock, a single enclosure can be manufactured and sold. The advantageous feature of having a separate modular security lock allows for customization of the enclosure such that, if needed, the security lock can be added on. The separate modular locking device may be added to an enclosure without any complexity. In certain examples, the security lock can be attached to the enclosure by a snap-fit connection, a press fit, or an adhesive. These and other features and advantages will be apparent from a reading of the following detailed description and a review of the associated drawings. A variety of additional aspects will be set forth in the description that follows. These aspects can relate to individual features and to combinations of features. It is to be understood that both the foregoing general description and the following detailed description are exemplary and explanatory only and are not restrictive of the broad concepts upon which the embodiments disclosed herein are based.

BRIEF DESCRIPTION OF THE DRAWINGS

The accompanying drawings, which are incorporated in and constitute a part of the description, illustrate several aspects of the present disclosure. A brief description of the drawings is as follows.

DETAILED DESCRIPTION

The present invention is described with reference to the accompanying drawings, in which certain embodiments of the invention are shown. This invention may, however, be embodied in many different forms and should not be construed as limited to the embodiments that are pictured and described herein; rather, these embodiments are provided so that this disclosure will be thorough and complete, and will fully convey the scope of the invention to those skilled in the art. It will also be appreciated that the embodiments disclosed herein can be combined in any way and/or combination to provide many additional embodiments.

Aspects of the present disclosure relate to telecommunications enclosures that can be customizable to meet customer needs. A telecommunications enclosure can be customized to include added security as desired. That is, a modular security lock may be utilized as an add-on feature for telecommunications enclosures. That is, the modular security lock is a separate piece adapted to be mounted to the telecommunications enclosure. The advantageous feature of having a separate security lock eliminates the need to stock multiple enclosures with or without this added security.

Figure 1:
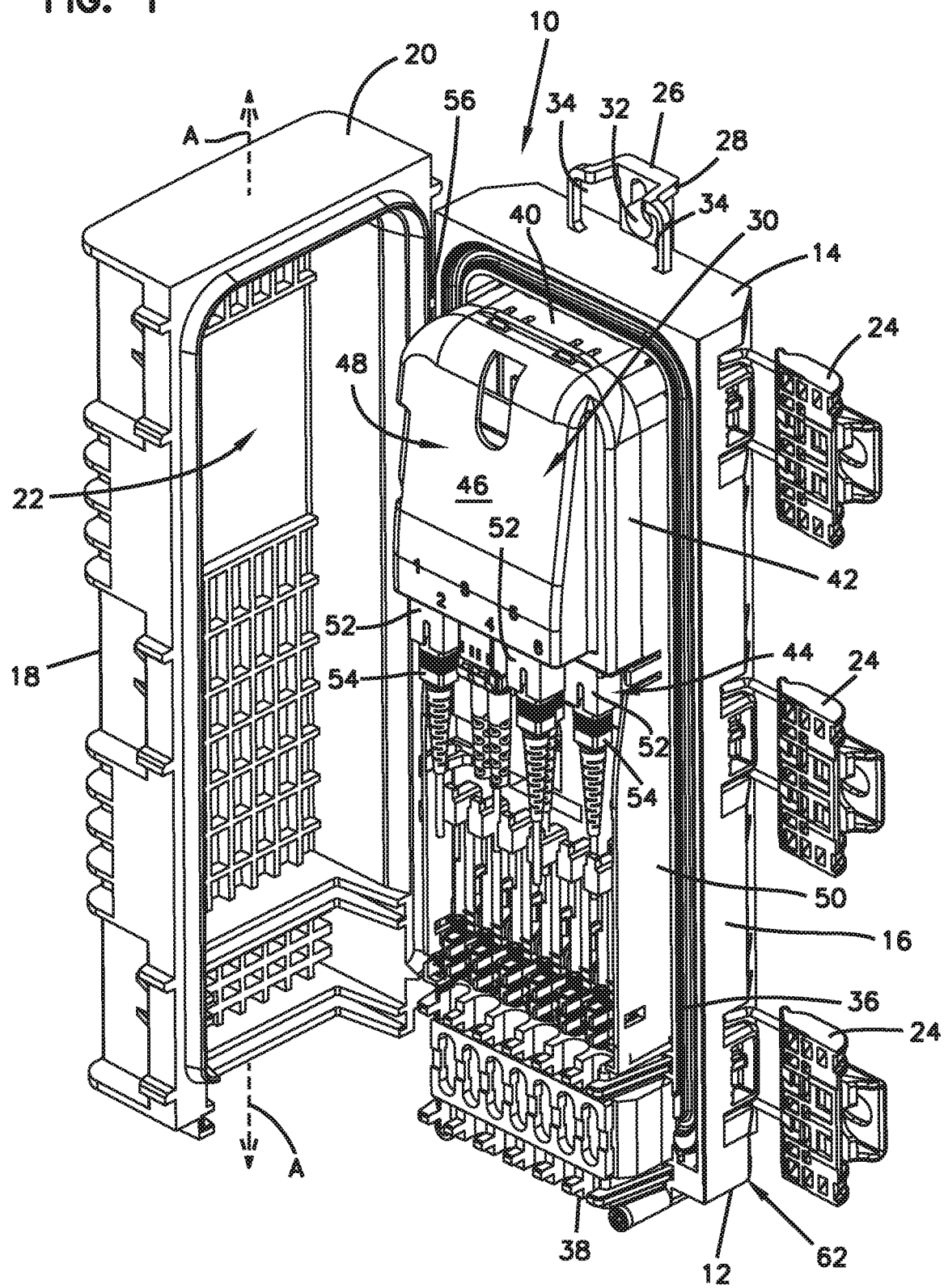
FIG. 1 is a front perspective view of an example telecommunications enclosure configured in accordance with the present disclosure, the telecommunications enclosure housing having a cover shown open relative to a base to expose a management unit.

FIG. 1 illustrates an example telecommunications enclosure 10 in accordance with the principles of the present disclosure. The telecommunications enclosure 10 includes a housing 20 and a management unit 30 that mounts within the interior of the housing 20. The housing 20 is elongate along a major axis A of the housing 20. The major axis A extends along a length of the housing 20 between first and second opposite ends 12, 14. The housing 20 is preferably re-enterable and environmentally sealed.

The housing 20 includes a base 16 and a cover 18 that cooperate to define an interior 22 of the housing 20. In certain examples, the cover 18 is pivotally connected to the base 16. In an example, the hinge axis of the housing 20 is parallel to the major axis A of the housing 20. The cover 18 is moveable relative to the base 16 between an open position and a closed position. In certain examples, the cover is pivotally movable between an open and closed position.

In certain examples, latches 24 are spaced about a perimeter of the housing 20 to clamp the cover 18 in the closed position. The cover 18 defines a front of the housing 20 and the base 16 defines a rear of the housing 20.

In certain implementations, the housing 20 includes a mounting structure 26 to hold the housing 20 to a pole, wall, or other surface. In some examples, the mounting structure 26 includes a mounting projection 28 defining a fastener opening 32 therethrough and also defining band clamp receptacles 34 between which the mounting projection 28 is positioned. In other examples, band clamp receptacles 34 are positioned at the first and second ends 12, 14 of the housing 20. Each of the band clamp receptacles 34 is configured to receive a band of a band clamp. In certain examples, the band clamps extend through the band clamp receptacles 34 in an orientation that extends along a minor axis of the housing 20.

The housing includes a sealing arrangement (not shown) for sealing the housing 20. The sealing arrangement can include a cable sealing arrangement at the first end 12 of the housing 20. The cable sealing arrangement can include a rear gel volume mounted in the base 16, a front gel volume mounted in the cover 18. In certain examples, an intermediate gel volume can be positioned between the front and rear gel volumes. The sealing arrangement may also include a perimeter seal 36 that extends about a perimeter of the housing 20 for sealing between the cover 18 and the base 16.

The management unit 30 mounts within the interior 22 of the housing 20. The management unit 30 has a length that extends between a first end 38 and an opposite second end 40. The management unit 30 includes a support infrastructure 42 that includes an adapter mounting location 44 and a front cover 46 positioned between the adapter mounting location 44 and the second end 40 of the management unit 30 at a front 48 of the management unit 30. The enclosure 10 is adapted to receive telecommunications hardware for splicing. The management unit 30 may include a tray 50, splice mounting components, a bank of adapters 52 mounted at the adapter mounting location 44 that may be covered by the tray 50 when the tray 50 is in the closed position and may be accessible from the rear of the management unit 30 when the tray 50 is in the open position. Drop cables with connectorized ends 54 can plug into the fiber optic adapters 52. An example enclosure having a management unit and an example sealing arrangement is disclosed by U.S. Provisional Patent Application No. 62/630,155, which is hereby incorporated by reference in its entirety.

Referring still to FIG. 1, the base 16 of the telecommunications enclosure 10 can be pivotally connected to the cover 18 by a hinge 56. The hinge 56 allows the base 16 and the cover 18 to pivot relative to one another about a pivot axis between a closed configuration (see FIG. 2) and an open position (see FIG. 1). The housing 20 includes a first side 58 and an opposite second side 60. The hinge 56 extends along the first side 58 of the housing 20. The latches 24 can be provided at both the first and second sides 58, 60 of the housing 20. In certain examples, at least one of the latches 24 can be disposed on at least one of a plurality of sidewalls 62 of the enclosure 10 for securing the base 16 and the cover 18 together in the closed position. In certain examples, a plurality of spaced latches 24 can be disposed on at least one of the plurality of sidewalls 62 of the enclosure 10. By opening the latches 24, the housing 20 can be moved to the open configuration of FIG. 1. In certain examples, the cover 18 can be non-pivotally connected to the base 16 such that the cover 18 is removable from the base 16 without pivoting therefrom.

Figure 2:
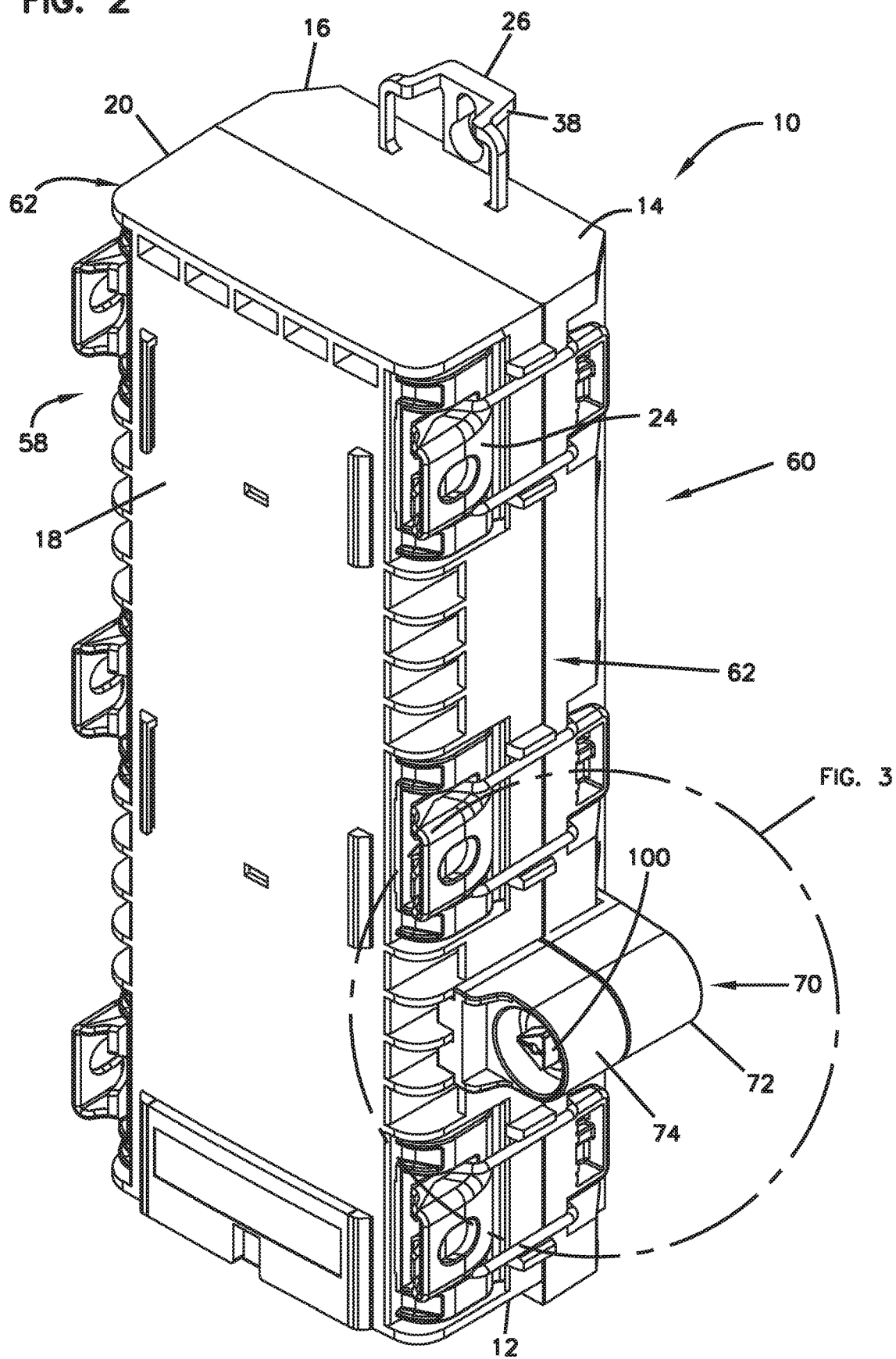
FIG. 2 shows the telecommunications enclosure of FIG. 1 in a closed position and a modular locking device in accordance with the principles of the present disclosure.

Referring to FIG. 2, the telecommunications enclosure 10 may be customizable to meet customer needs. For example, the telecommunications enclosure 10 can be customizable to include a modular locking device 70. The modular locking device 70 can be an add-on feature adapted to be mounted to the telecommunications enclosure 10 to provide added security and limit access to the interior 22 of the housing 20. That is, the modular locking device 70 can be a separate piece that is mounted to the telecommunications enclosure 10. The modular locking device 70 is adapted to be mounted to the housing 20 between the spaced latches 24. In certain examples, the modular locking device 70 is removably secured to the enclosure 10. The modular locking device 70 can be mounted to the housing by press-fit, a snap-fit connection, and/or an adhesive. In certain examples, the modular locking device 70 is adapted to be fixed to the enclosure 10 such that the modular locking device 70 is not removable.

Figure 3:
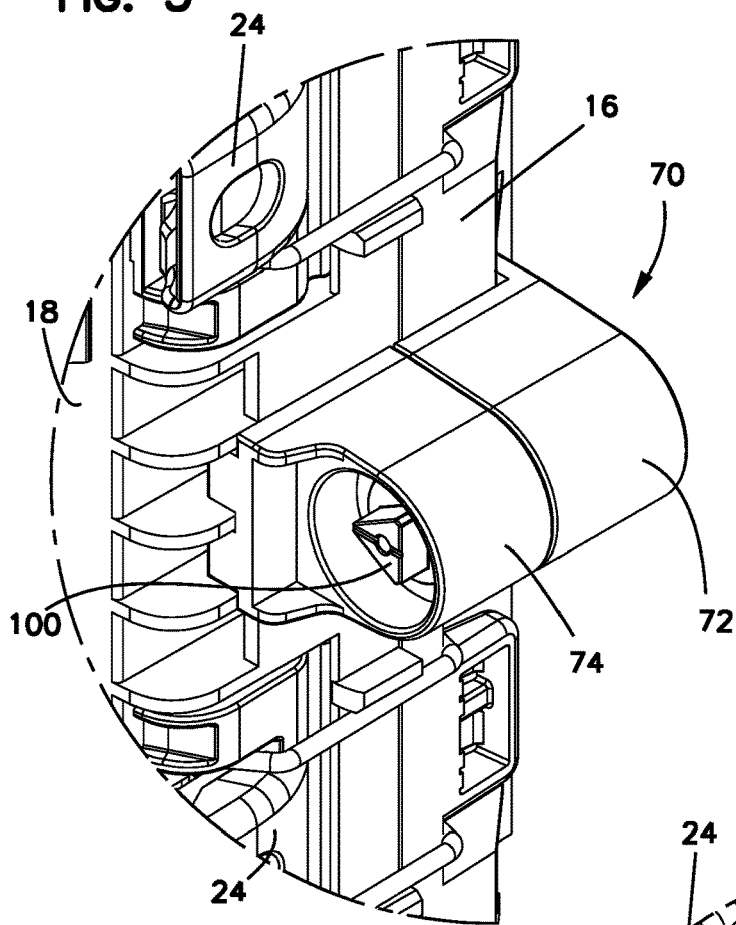
FIG. 3 is an enlarged top perspective view of the modular locking device of FIG. 2.
Figure 4:
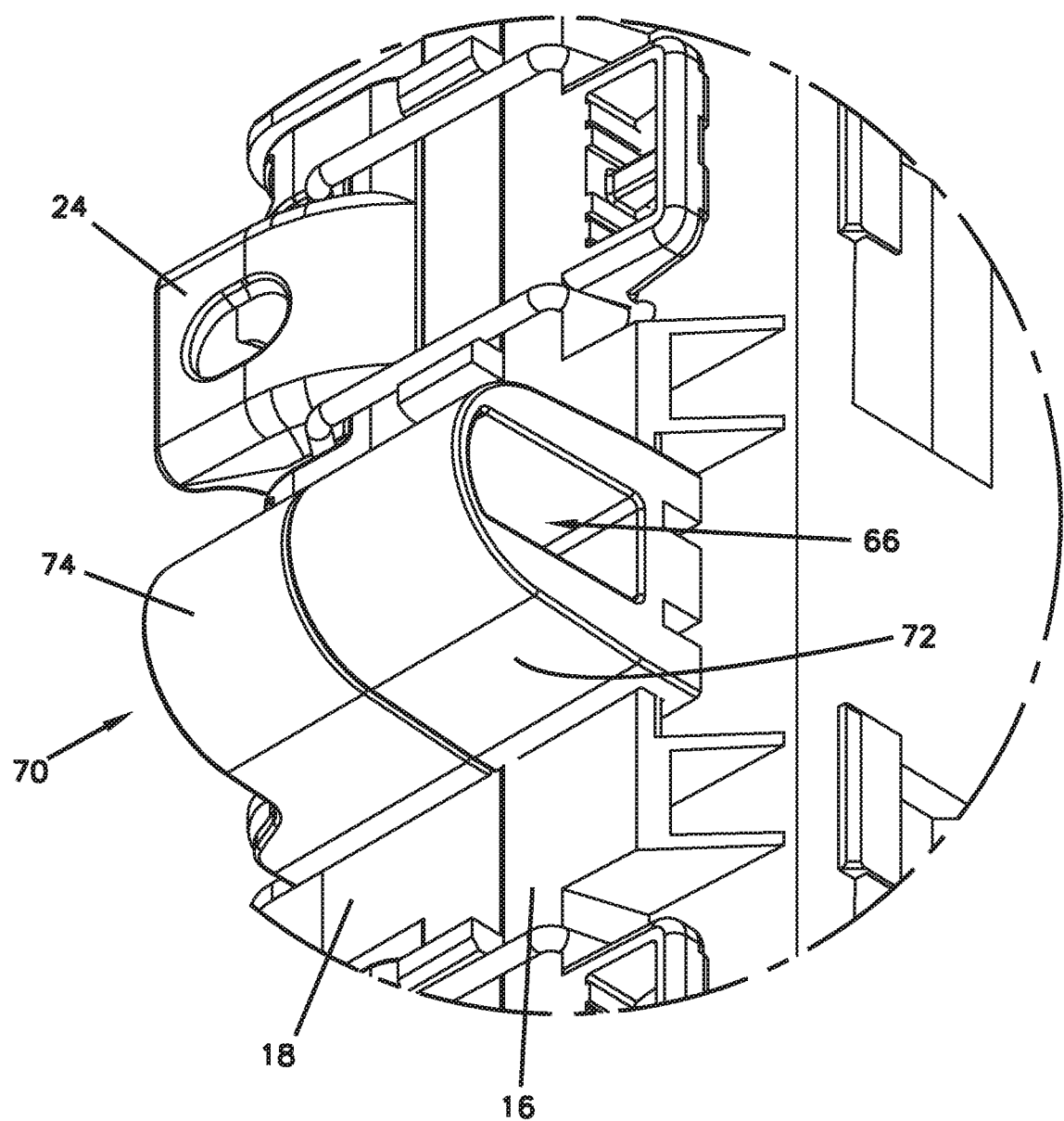
FIG. 4 is a bottom perspective view of the modular locking device of FIG. 3.

Turning to FIGS. 3-4, the modular locking device 70 is shown mounted to the enclosure 10. In certain examples, the modular locking device 70 is manufactured of a polymeric material, although alternatives are possible. The modular locking device 70 can include a first locking member 72 mountable to the base 16 of the enclosure 10 and a second locking member 74 mountable to the cover 18 of the enclosure 10. The first and second locking members 72, 74 can each be a unitary molded plastic part. The first locking member 72 defines an opening 66 (e.g., aperture, cavity) generally rectangular in shape, although alternatives are possible. The locking member 74 can define a similar opening that aligns with the opening 66 when the enclosure 10 is closed. A locking element can be inserted through the openings of the locking members 72, 74 to secure the locking members 72, 74 together such that the enclosure 10 is prevented from being opened.

Figure 5:
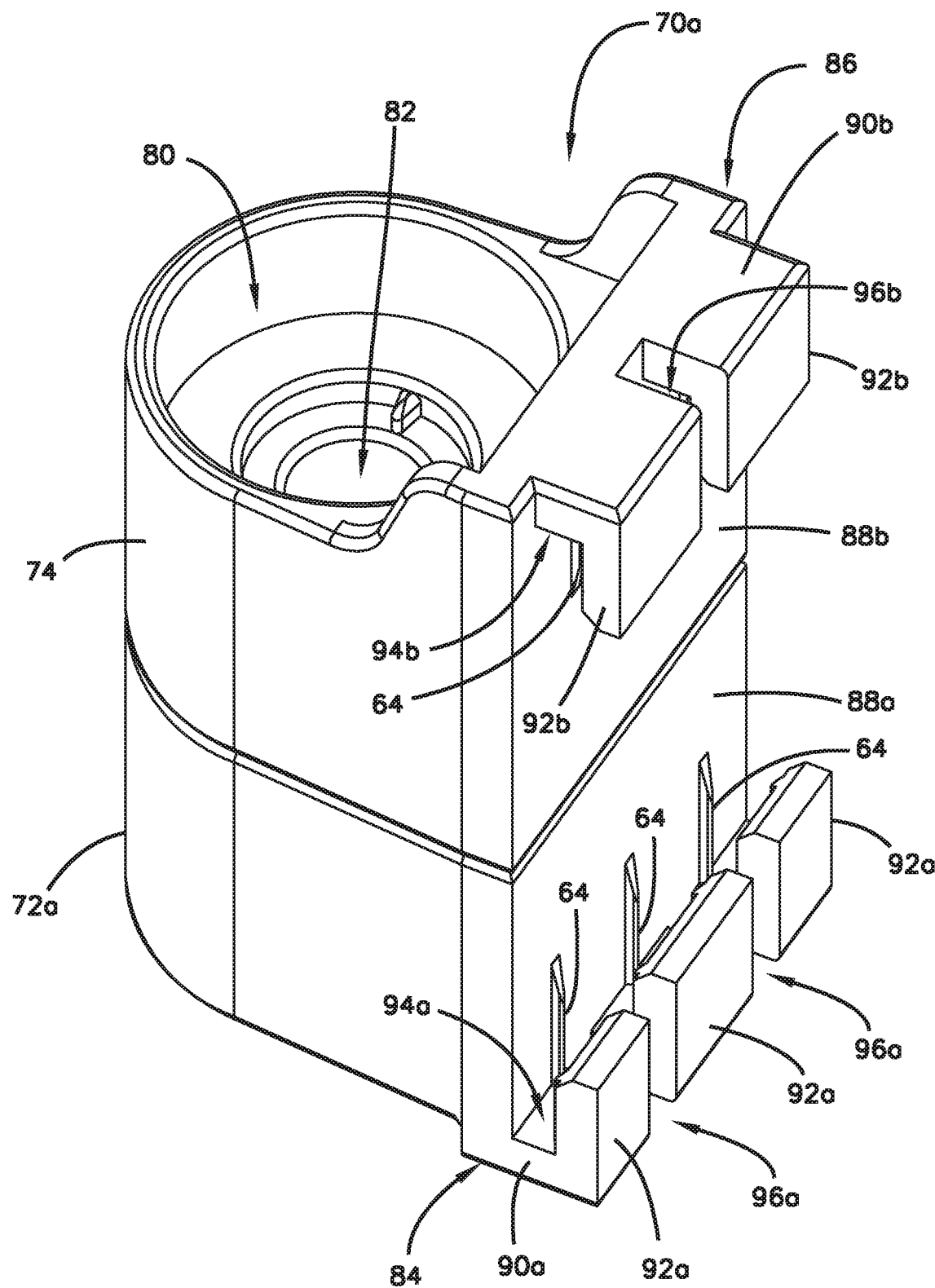
FIG. 5 is a perspective view of another example modular locking device in accordance to the principles of the present disclosure.
Figure 6:
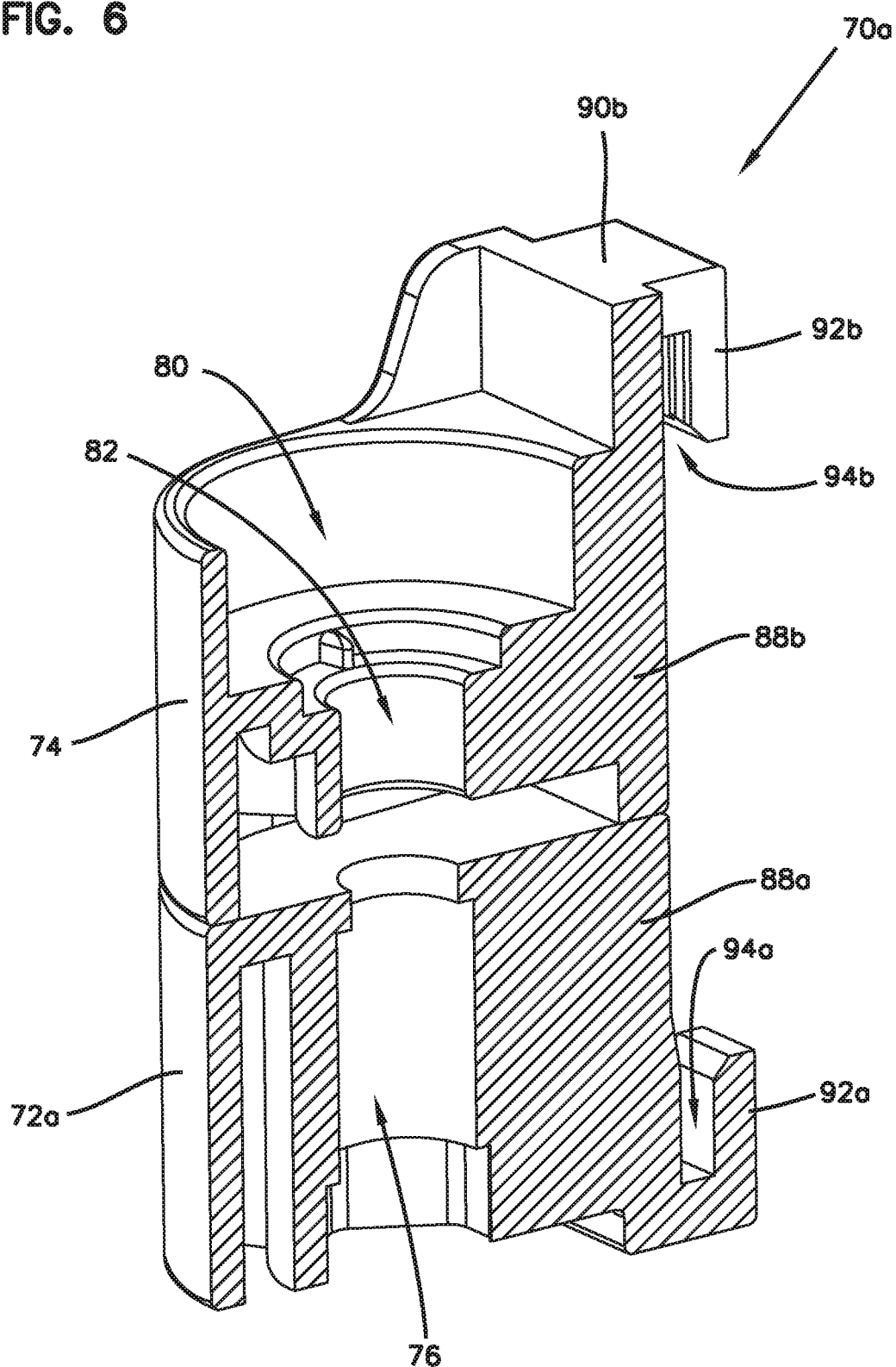
FIG. 6 is a cross-section view of the modular locking device of FIG. 5.
Figure 9:
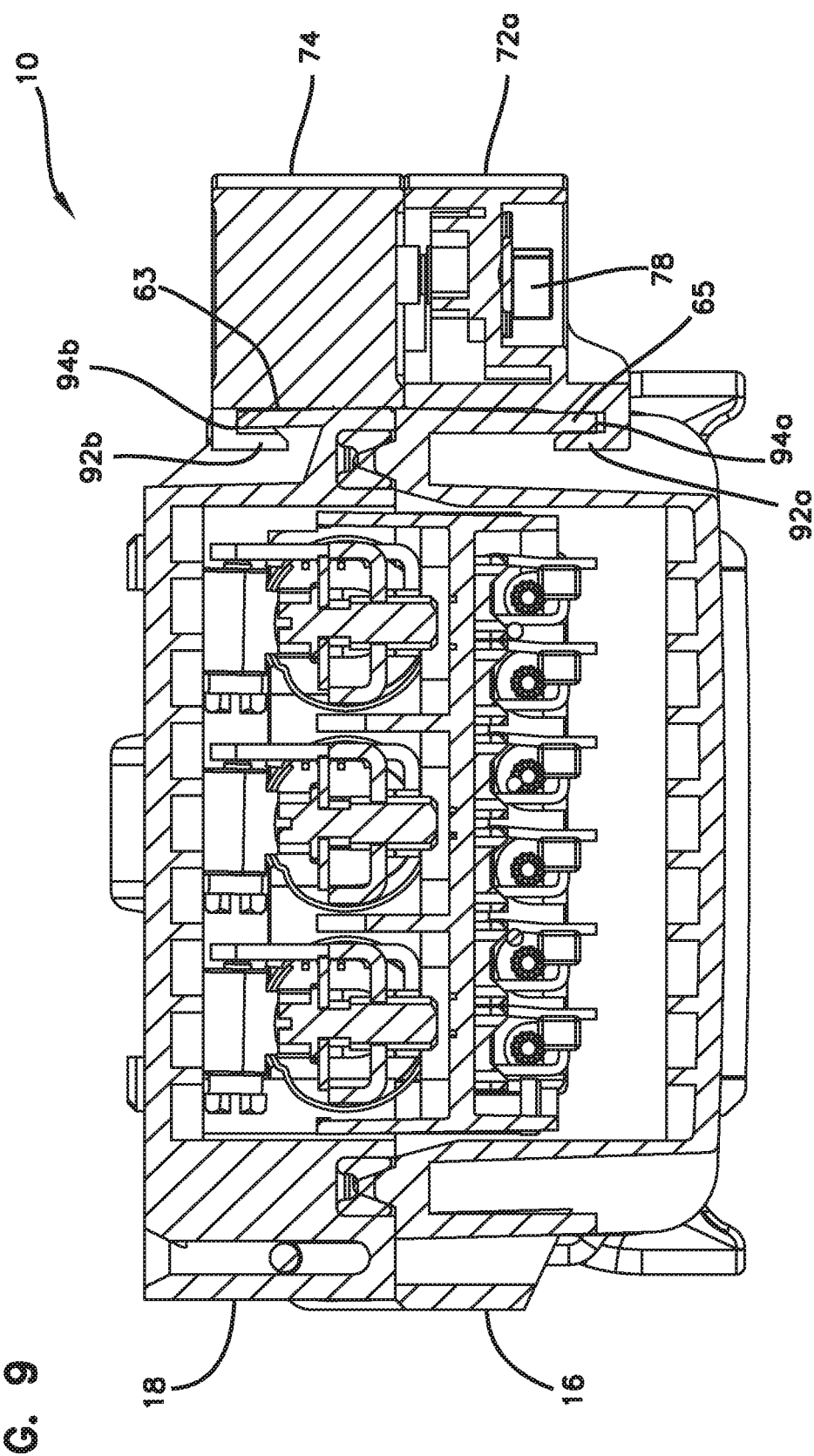
FIG. 9 is a cross-section view taken along section line 9-9 of FIG. 8.

Referring to FIGS. 5-6, another example modular locking device 70a is shown with an alternative first locking member 72a that defines a first aperture 76 (e.g., opening, hole, cavity) that is generally circular for receiving therein a securing element 78 (e.g., bolt, padlock, screw, lock)(see FIG. 9). The second locking member 74 has a recessed top 80 and a second aperture 82 (e.g., opening, cavity, recess, hole) for receiving therein a portion of the securing element 78. The securing element 78 can be adapted to couple the first and second locking members 72a, 74 together when the cover 18 is in the closed position. In use, the securing element 78 securely locks the base 16 and the cover 18 together. That is, during use, the securing element 78 prevents the cover 18 from moving from the closed position to the open position.

Figure 7:
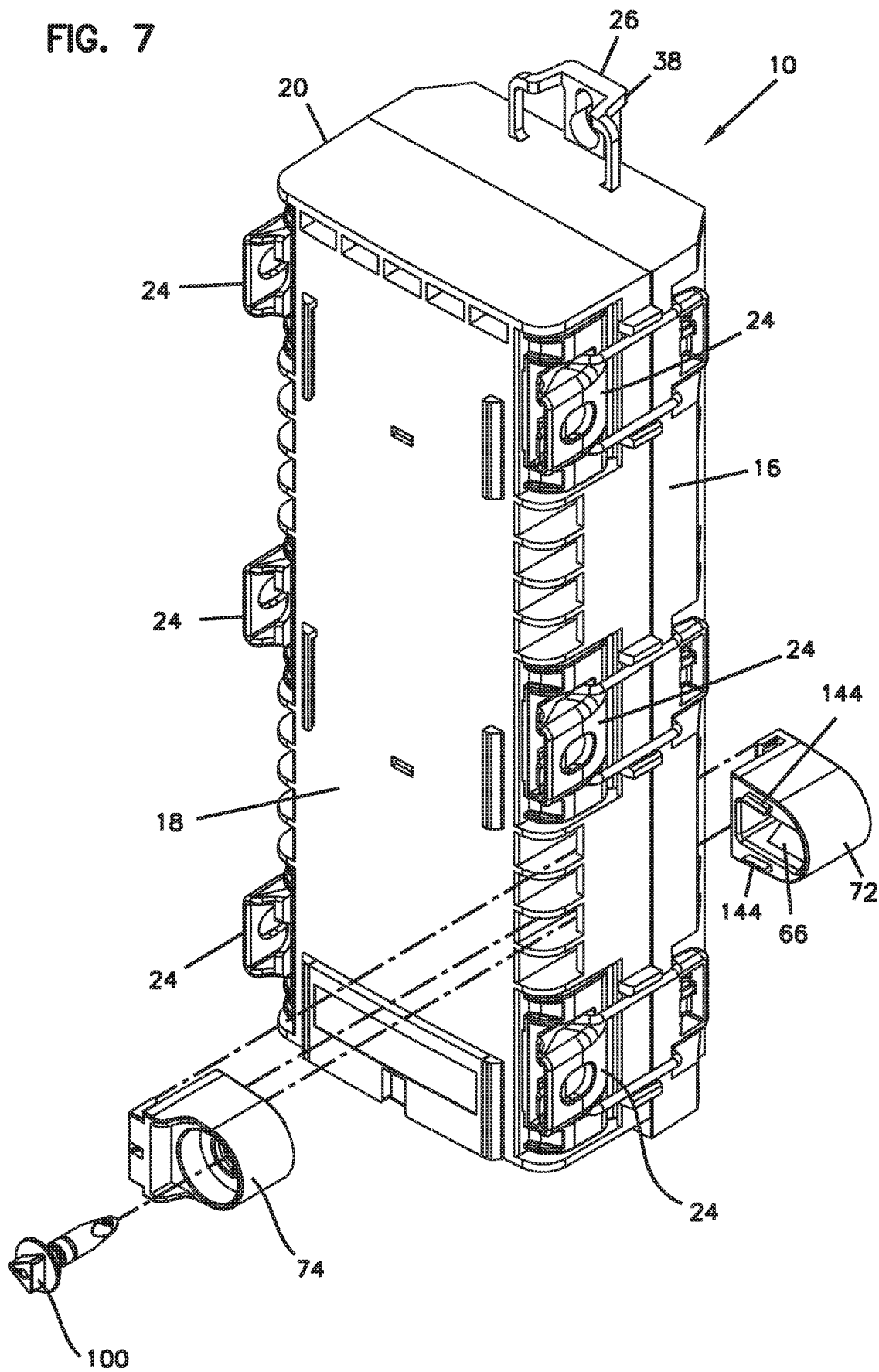
FIG. 7 is a perspective view of the telecommunications enclosure of FIG. 2 showing an exploded view of the modular locking device.

The first locking members 72, 72a can each include a first hook member 84 and the second locking member 74 can include a second hook member 86. The first and second hook members 84, 86 can respectively include a face plate 88a, 88b, a horizontal member 90a, 90b extending in a transverse direction relative to respective face plates 88a, 88b, and leg members 92a, 92b extending parallel to respective face plates 88a, 88b to define respective hook receptacles 94a, 94b that are adapted to respectively receive external structure 63, 65 (e.g., flanges, lips, walls, etc.) on the base 16 and cover 18 of the enclosure 10 (see FIGS. 7-9). In certain examples, the horizontal members 90a, 90b respectively define gaps 96a, 96b such that the respective leg members 92a, 92b are spaced from each other, although alternatives are possible. For example, the horizontal members 90a, 90b may be configured without gaps 96a, 96b. The first and second face plates 88a, 88b may each include ribs or flexible tags 64 that respectfully extend outwardly therefrom for frictionally engaging the enclosure 10 when the first and second locking members 72, 72a, 74 are mounted thereto.

In certain examples, the first hook member 84 may be monolithically formed with the first locking members 72, 72a to define a one-piece unit and the second hook member 86 may be monolithically formed with the second locking member 74 to define a one-piece unit, although alternatives are possible. In certain examples, the first and second hook members 84, 86 may be respectively coupled to the first and second locking members 72, 72a, 74. In certain examples, the first and second hook members 84, 86 may have a J-shape, although alternatives are possible. Although the first hook member 84 is shown with three leg members 92a, any number of leg members 92a may be used. Although the second hook member 86 is shown with two leg members 92b, any number of leg members 92b may be used.

Figure 3A:
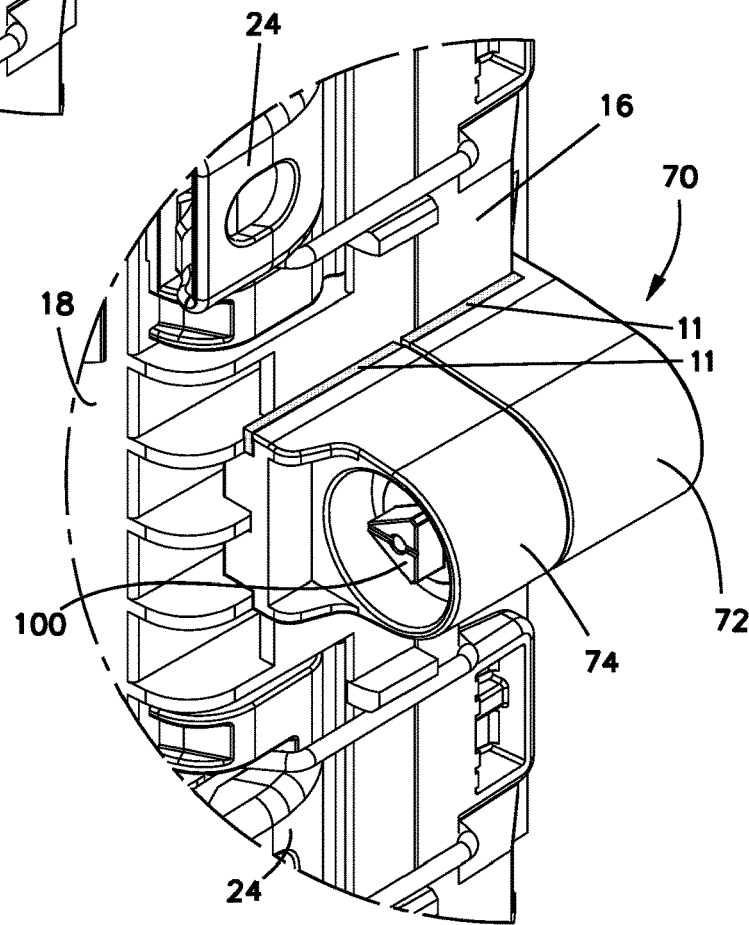
FIG. 3A is the enlarged top perspective of FIG. 3 with additional detail.
Figure 8:
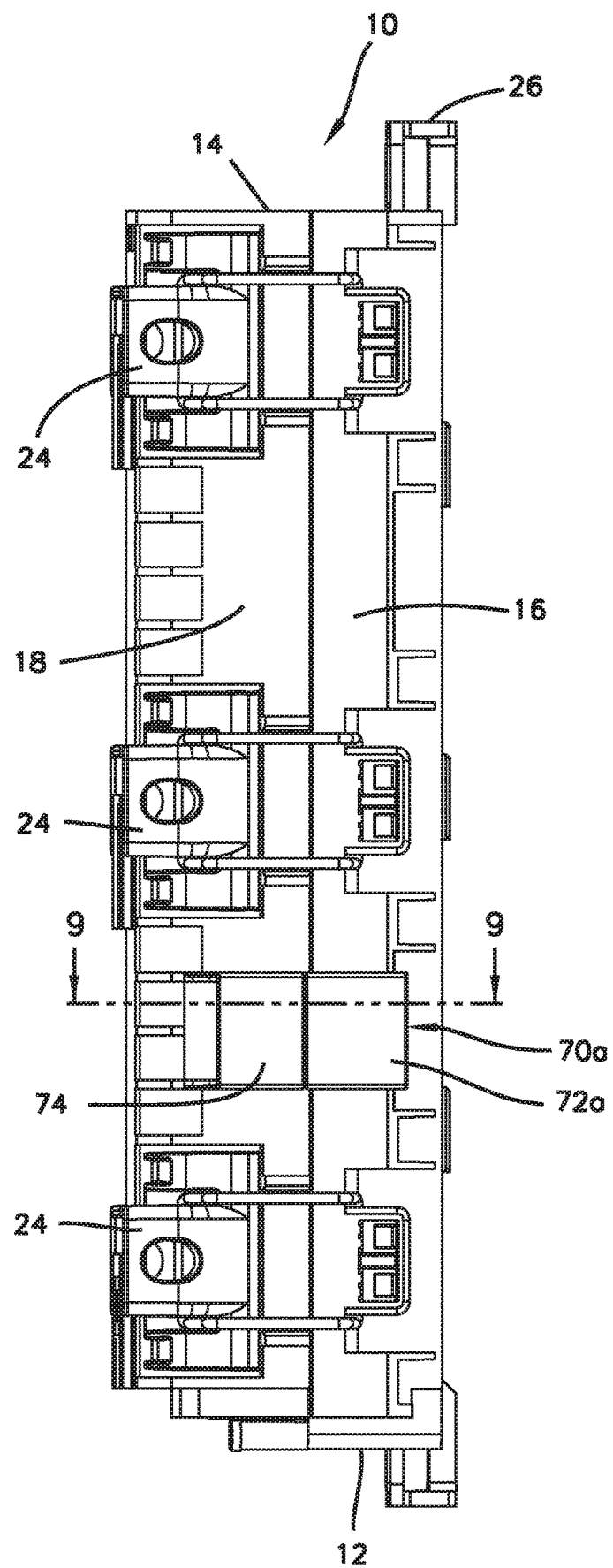
FIG. 8 is a side view of the telecommunications enclosure of FIG. 2 with the modular locking device of FIGS. 5-6 thereon.

Referring to FIGS. 8-9, the first and second hook members 84, 86 of the first and second locking members 72, 72a, 74 can be in snap-fit engagement with the enclosure 10. In certain examples, the first and second locking members 72, 72a, 74 can be mounted to the enclosure 10 by a friction fit. In certain examples, the first and second locking members 72, 72a, 74 can be attached to the enclosure 10 with an adhesive 11 (see FIG. 3A). When the first and second locking members 72, 72a, 74 are mounted to the enclosure 10, the first and second hook receptacles 94a, 94b are oriented to face each other.

Figure 10:
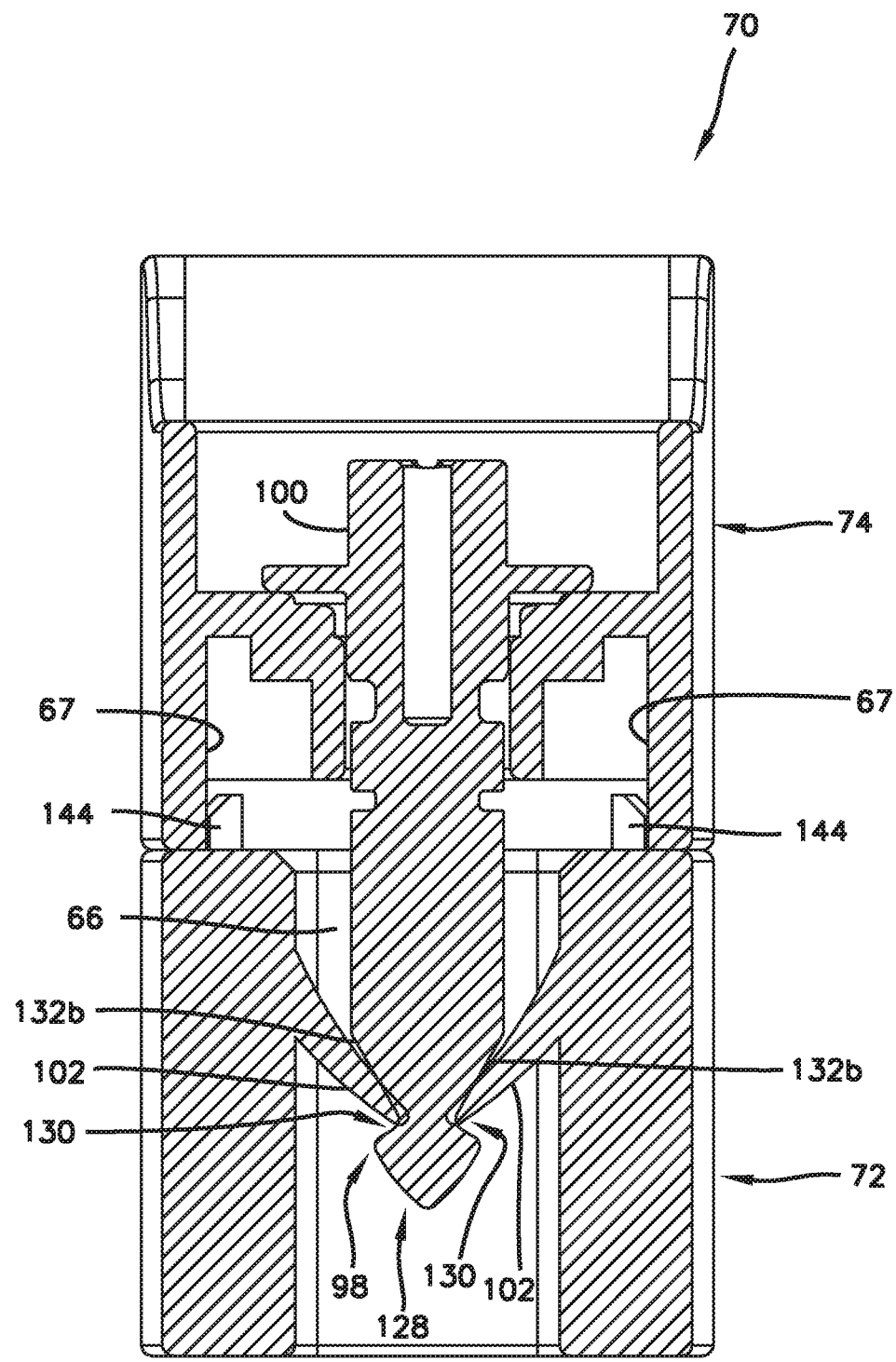
FIG. 10 is a cross-section view of the modular locking device of FIG. 3.

Referring to FIG. 10, the first and second locking members 72, 74 are shown coupled together by a fastening system 98. The fastening system 98 includes a fastening lock 100 (i.e., bolt, securing element) and retention members 102 in the form of flaps. Of course, alternative fastening mechanism may be employed.

Turning to FIGS. 10-15, the fastening lock 100 and the retention members 102 will be described. The fastening lock 100 includes an elongated shank 104 having a first end 106 and a second end 108 opposite the first end 106, and a bolt head 110. The bolt head 110 includes a wrenching section 112 and a flange section 114. The wrenching section 112 includes three side surfaces 116 that define a triangle when viewed from the top, although alternatives are possible. The flange section 114 is a flat cylinder segment positioned intermediate the wrenching section 112 and the shank 104. The flange section 114 can be positioned adjacent to the first end 106. A wrenching tool (not shown) may be utilized on the wrenching section 112 to locate the fastening lock 100 at a particular location during installation. When the fastening lock 100 is inserted into the second aperture 82, the flange section 114 can rest on base 68 positioned within the recessed top 80.

In certain examples, the flange section 114 has a diameter 118 greater than a diameter 120 of the bolt head 110. In certain examples, the shank 104 has a diameter 122 that is similar to the diameter 120 of the bolt head 110, although alternatives are possible. In certain examples, the diameter 118 of the flange section 114 is at least 0.5 times the diameter 120 of the bolt head 110, although alternatives are possible. In certain examples, the diameter 118 of the flange section 114 is no more than twice the diameter 120 of the bolt head 110, although alternatives are possible.

In certain examples, the diameter 118 of the flange section 114 is at least 0.5 times the diameter 122 of the shank 104, although alternatives are possible. In certain examples, the diameter 118 of the flange section 114 is at least 1.0 times the diameter 122 of the shank 104, although alternatives are possible. In certain examples, the diameter 118 of the flange section 114 is at least 1.5 times the diameter 122 of the shank 104, although alternatives are possible. In certain examples, the diameter 118 of the flange section 114 is no more than twice the diameter 122 of the shank 104, although alternatives are possible.

In certain examples, the flange of the bolt provides a washer bearing surface and thickness in compliance with industry standards in the structural steel framing industry. In one or more embodiments, the bolt head 110 can consist of any type of bolt head size and shape known in the art (e.g., hex head, carriage bolt head, truss head, fillister head, etc.). In certain examples, the shank 16 can define a first recess 124a that is positioned at the first end 106 and a second recess 124b spaced a distance X from the first recess 124a, although alternatives are possible. The second recess 124b can be positioned farther from the flange section 114 than the first recess 124a.

In certain examples, the shank 104 can have a nose portion 128 at the second end 108 with two notches 130 (e.g., grooves, slots) formed therein. The two notches 130 can be defined on opposing sides of the nose portion 128. In certain examples, each notch 130 can form tapered surfaces 132a, 132b. Ramped surfaces 134 of the nose portion 128 together forming respective first and second nose corners 136, 138, where the ramped surfaces 134 separate the first and second nose corners 136, 138. The first nose corners 136 can extend below the notches 130 and the second nose corners 138 can extend between the notches 130.

Figure 11:
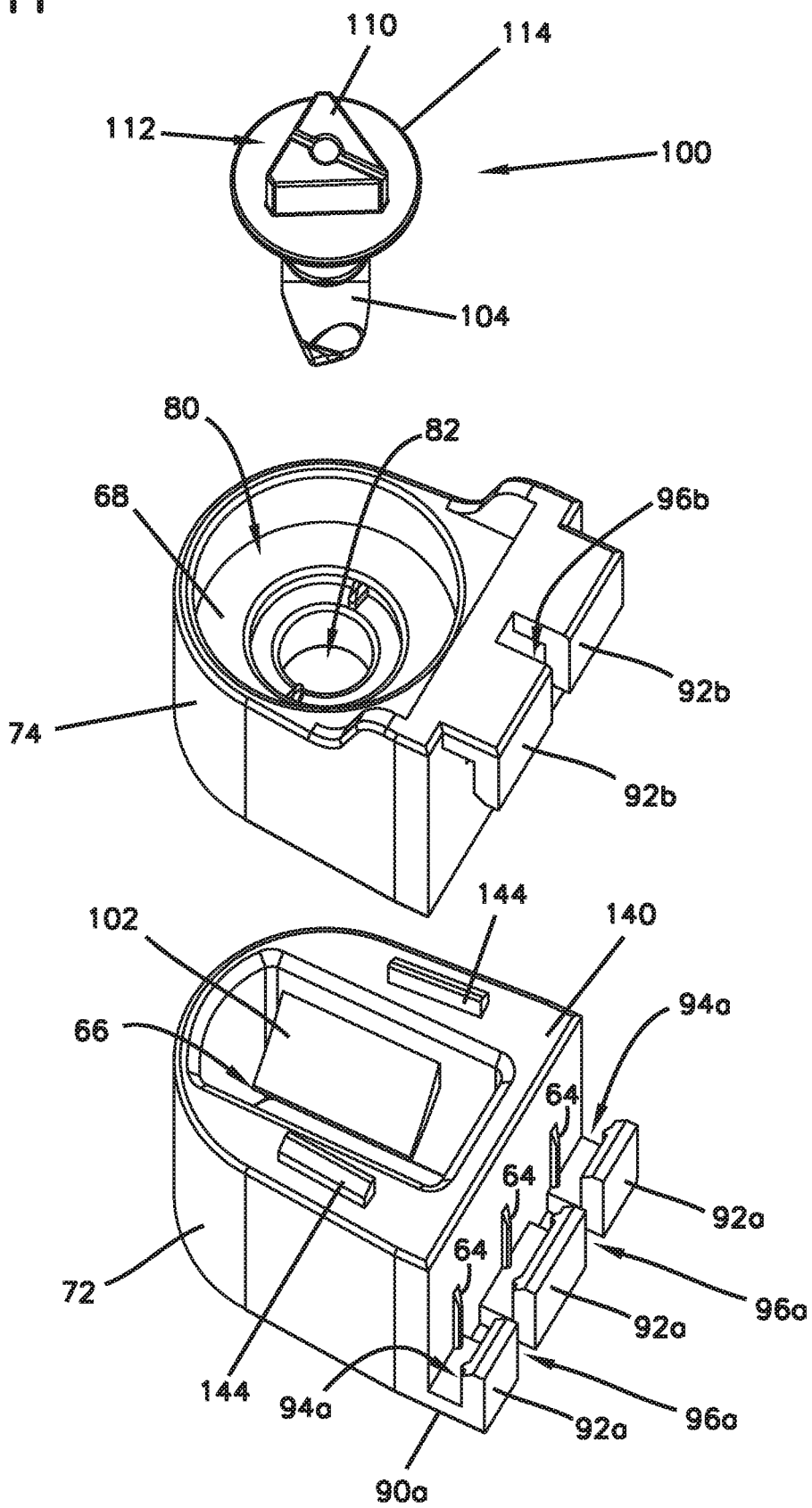
FIG. 11 is an exploded view of the modular locking device of FIG. 10 showing a securing element in accordance with the principles of the present disclosure.
Figure 12:
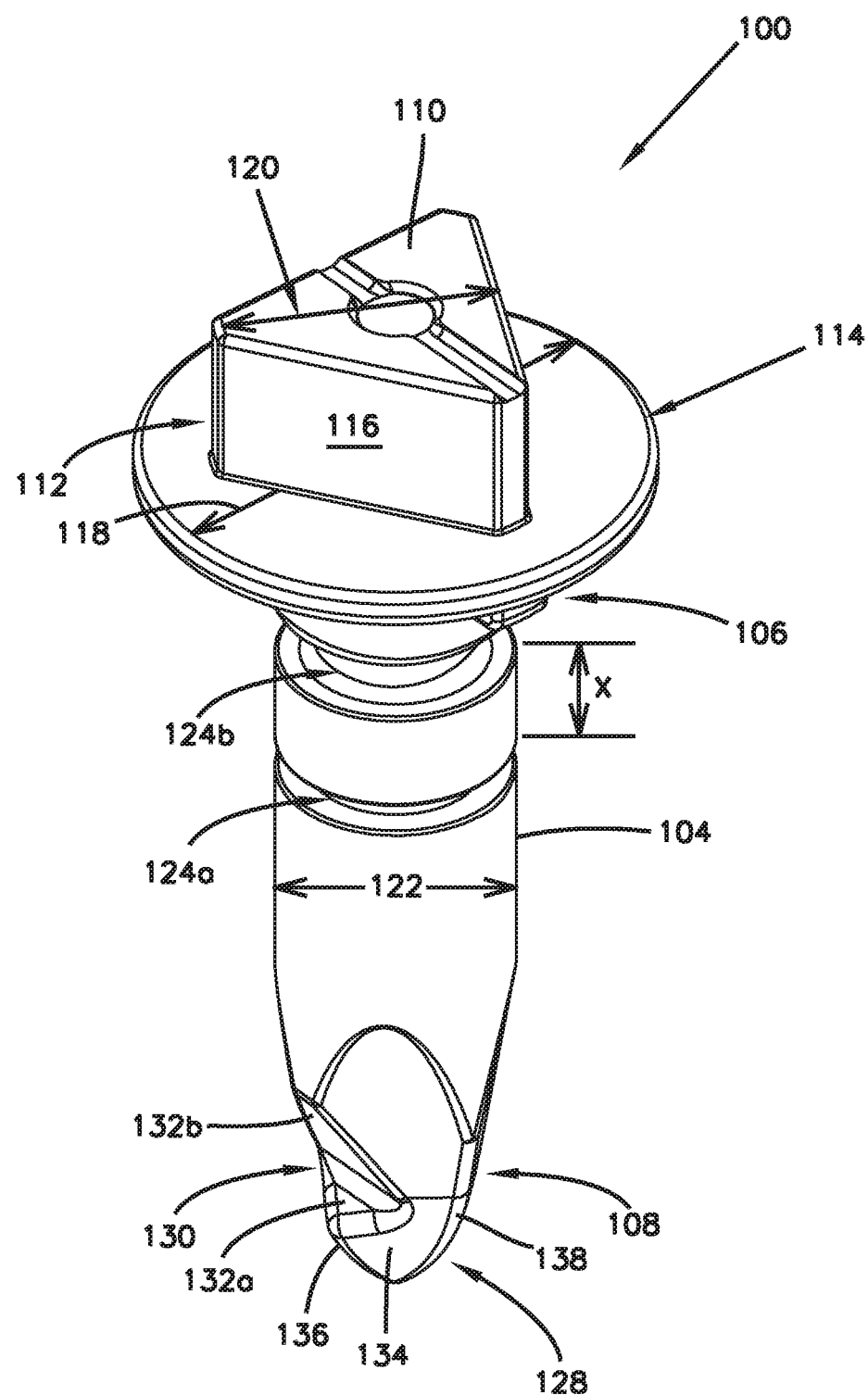
FIG. 12 is a perspective view of the securing element of FIG. 11.

Turning to FIG. 11, the opening 66 can include the retention members 102 which are shown sloped downwardly therein. The opening 66 can be defined in a majority top surface 140 of the first locking member 72, although alternatives are possible. The retention members 102 each have an edge 142 that is adapted to be fitted into notches 130. That is, the edge 142 of the retention members 102 is configured to be received in corresponding notches 130 defined in the fastening lock 100.

The top surface 140 of the first locking members 72 can include alignment members 144 positioned on opposite sides of the opening 66. In the example depicted, there are two alignment members 144, although alternatives are possible. The alignment members 144 extend upwardly from the top surface 140 of the first locking member 72. The alignment members 144 are configured and arranged to prevent misalignment of the first and second locking members 72, 74 when coupled together. The alignment members 144 being configured to align with inner walls 67 (see FIG. 10) of the second locking member 74. It will be appreciated that the first locking member 72a can also include alignment members 144 on opposite sides of the first aperture 76.

Figure 13:
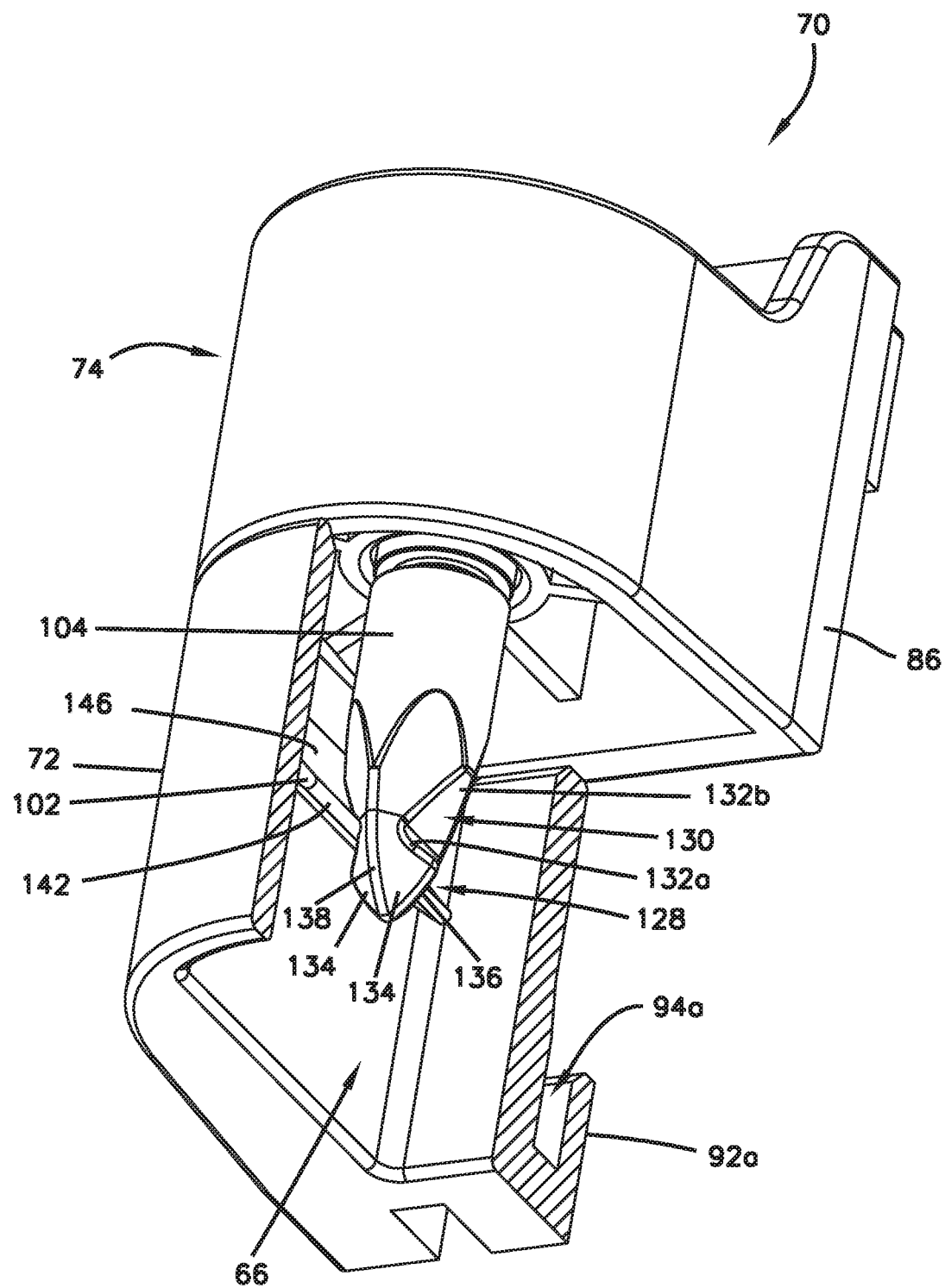
FIG. 13 is a bottom perspective, partial cross-section view of the modular locking device of FIG. 10.
Figure 14:
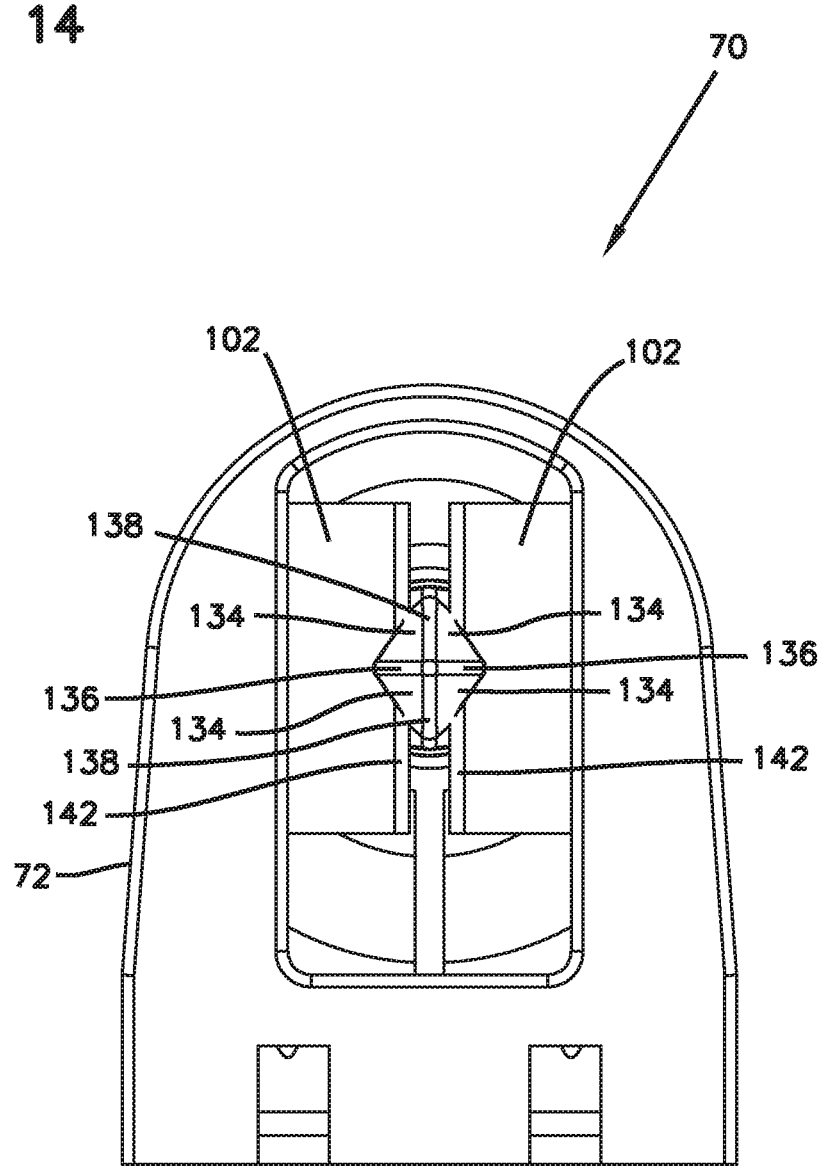
FIG. 14 is a bottom view of the modular locking device of FIG. 10.
Figure 15:
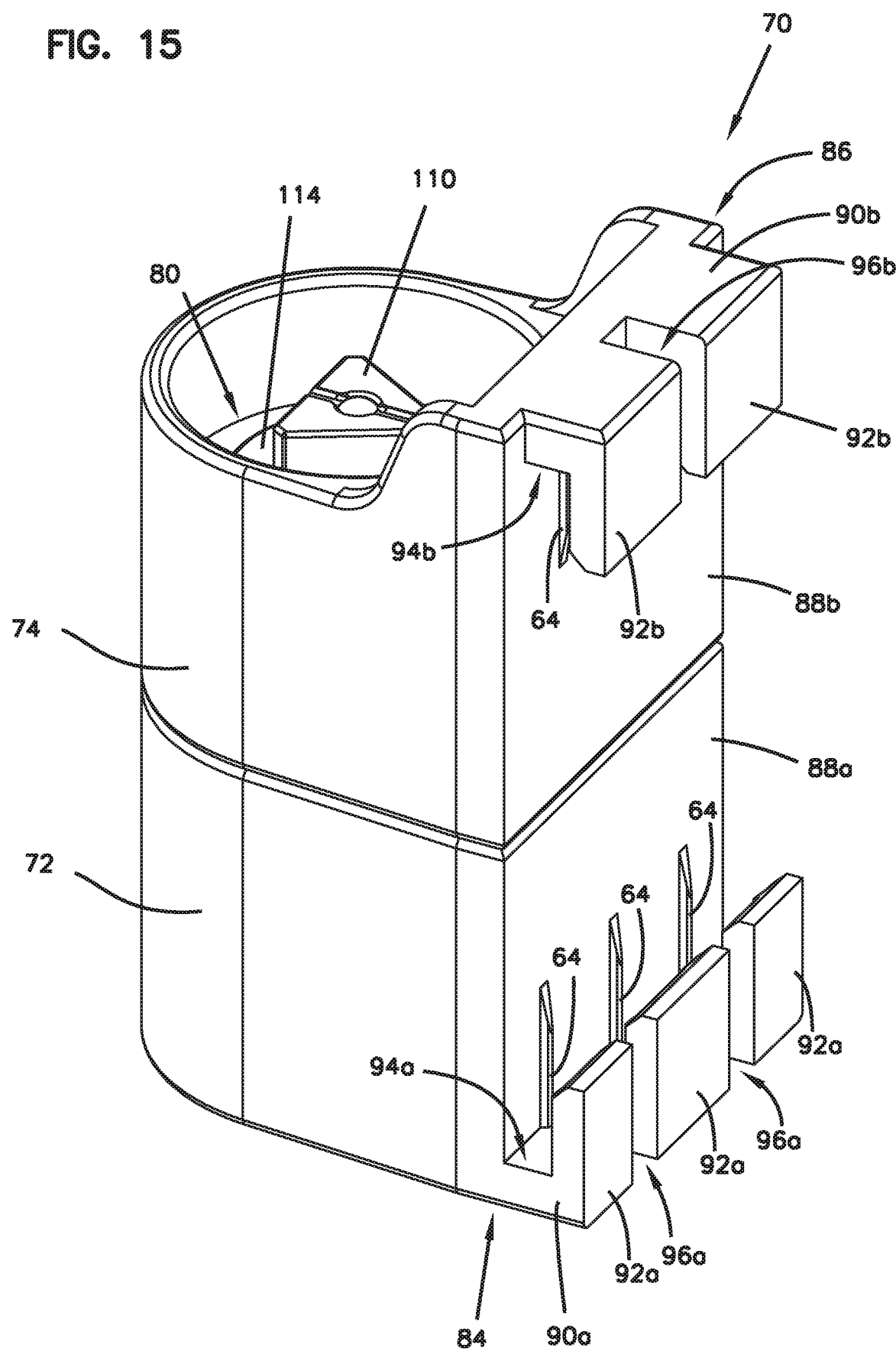
FIG. 15 is a perspective view of the modular locking device of FIG. 10.

The fastening lock 100 can be inserted into the second aperture 82 and through the opening 66. Continued movement of the fastening lock 100 can cause the second nose corners 138 to engage sloped surfaces 146 of the retention members 102. Although the fastening lock 100 can be fully inserted while in this position, the fastening lock 100 can easily be removed from the first and second locking members 72, 74 because the second nose corners 138 do not have structure for receiving the edge 142 of the retention members 102. That is, the edge 142 of the retention members 102 can slide up and down along the second nose corners 138 when the fastening lock 100 is not in a locked position. Rotation of the fastening lock 100 about a quarter turn when fully inserted can provide a locking position as shown in FIGS. 10 and 13-14 in which the edge 142 of respective retention members 102 can be received into corresponding notches 130 defined in the shaft 104 to secure the first and second locking members 72, 74 together. The ramped surfaces 132b of the notches 130 can help to prevent the fastening lock 100 from being removed from the opening 66. In certain examples, the retention members 102 may be flexible upon engagement with the fastening lock 100.

Figure 16:
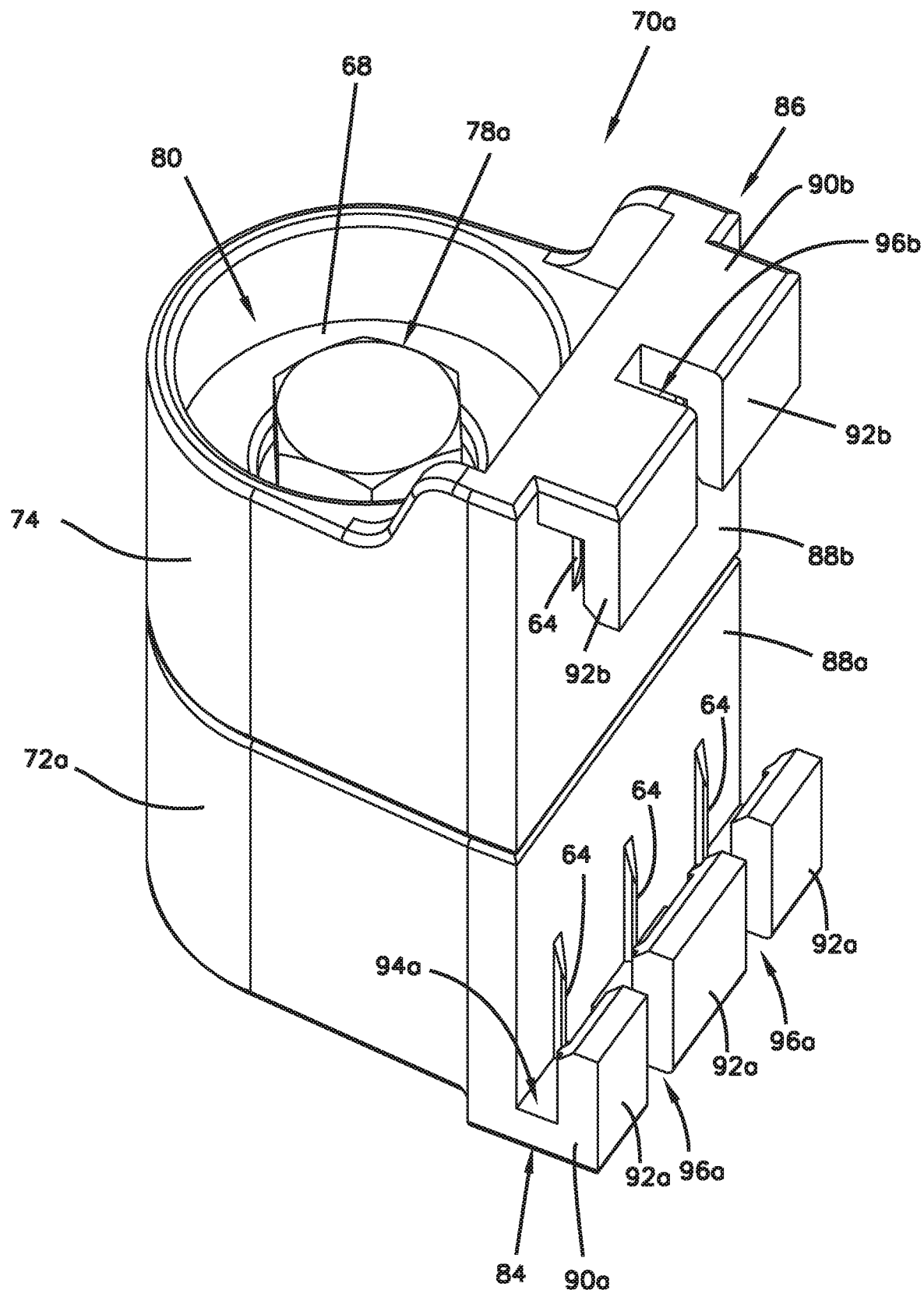
FIG. 16 is a perspective view of the modular locking device of FIGS. 5-6 with another securing element in accordance with the principles of the present disclosure.
Figure 17:
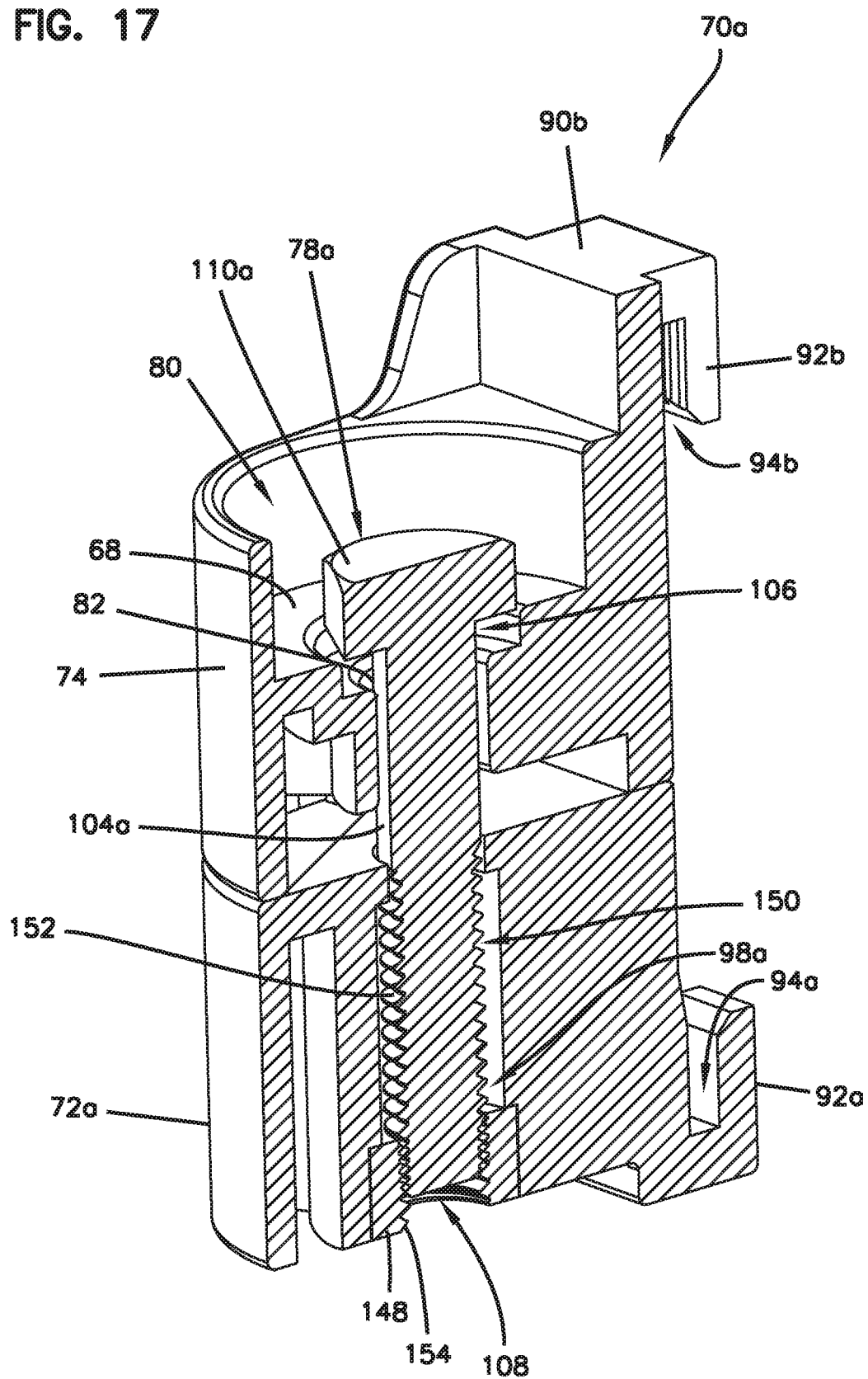
FIG. 17 is a cross-section view of the modular locking device of FIG. 16.

Turning to FIGS. 16-17, another modular locking device 70a is shown with another example fastening system 98a that includes a securing element 78a (e.g., screw, bolt) and a nut 148 that threadedly mates with the securing element 78a for securing the first and second locking members 72a, 74 together. The securing element 78a includes an elongated shank 104a having a first end 106 and a second end 108 opposite the first end 106, and a bolt head 110a positioned adjacent the first end 106. In one or more embodiments, the bolt head 110a can consist of any type of bolt head size and shape known in the art (e.g., hex head, carriage bolt head, truss head, fillister head, etc.). In the example depicted, the securing element 78a is a hex-headed threaded bolt, although alternatives are possible. The shank 104a of the securing element 78a has a threaded portion 150 having external bolt threads 152.

The nut 148 can have a plurality of internal nut threads 154. The nut 148 can include any type of nut, such as a hex nut, square nut, cap nut, wing nut, flange nut, etc. The nut threads 154 can be sized and shaped to threadedly engage the bolt threads 152 whereby when the nut threads 154 engage the bolt threads 152 when tightened in a clockwise direction, the first and second locking members 72a, 74 can be secured together on the enclosure 10. In certain examples, the nut 148 may be formed integral with the first locking member 72a, although alternatives are possible. In certain examples, the nut 148 may be a separate piece from the first locking member 72a. In certain examples, any type of appropriate washers can be used with the fastening system 98a, such as flat, square, locking, dock, fender, etc. (not shown in the Figures).

Figure 18:
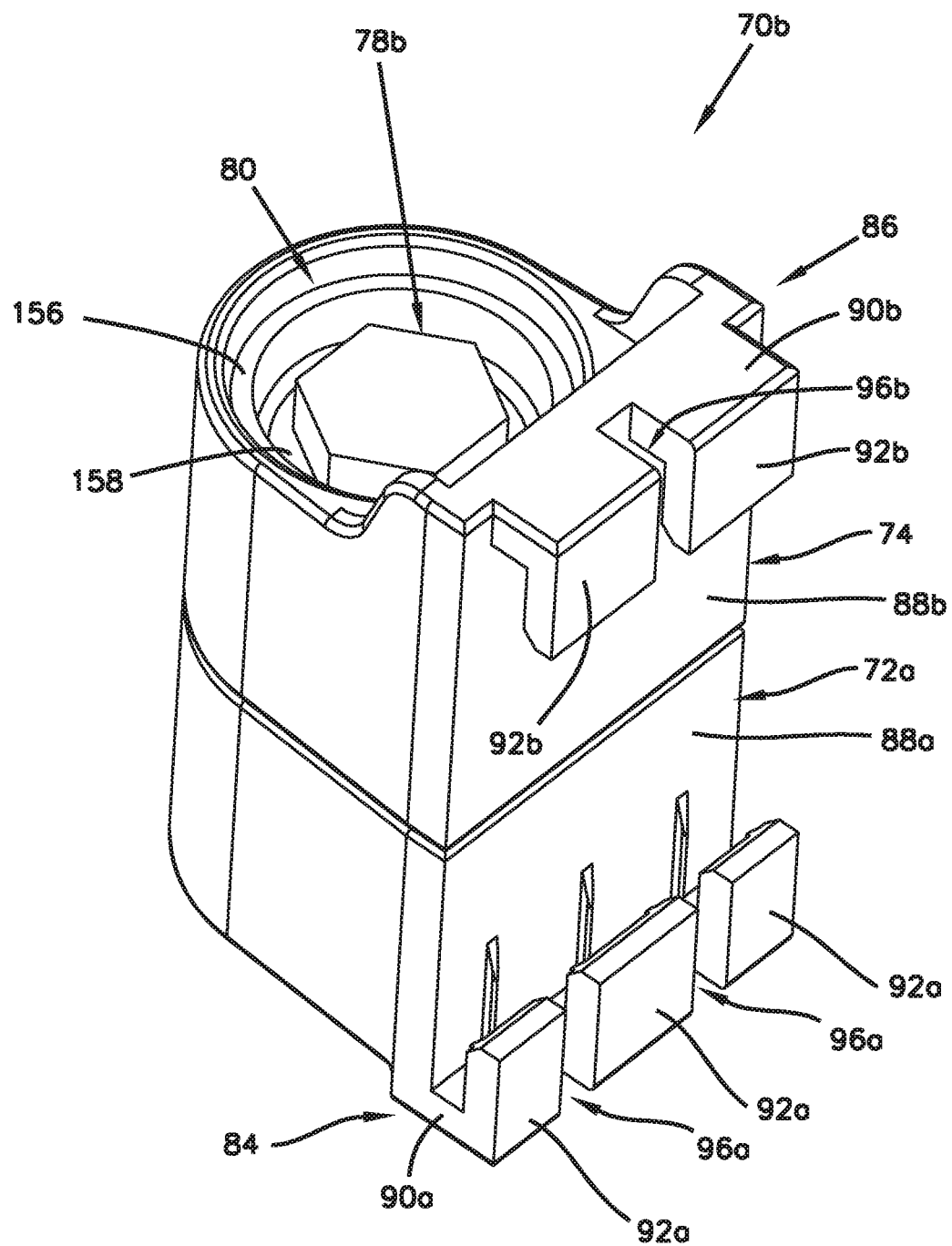
FIG. 18 is another example modular locking device and another securing element in accordance with the principles of the present disclosure.
Figure 19:
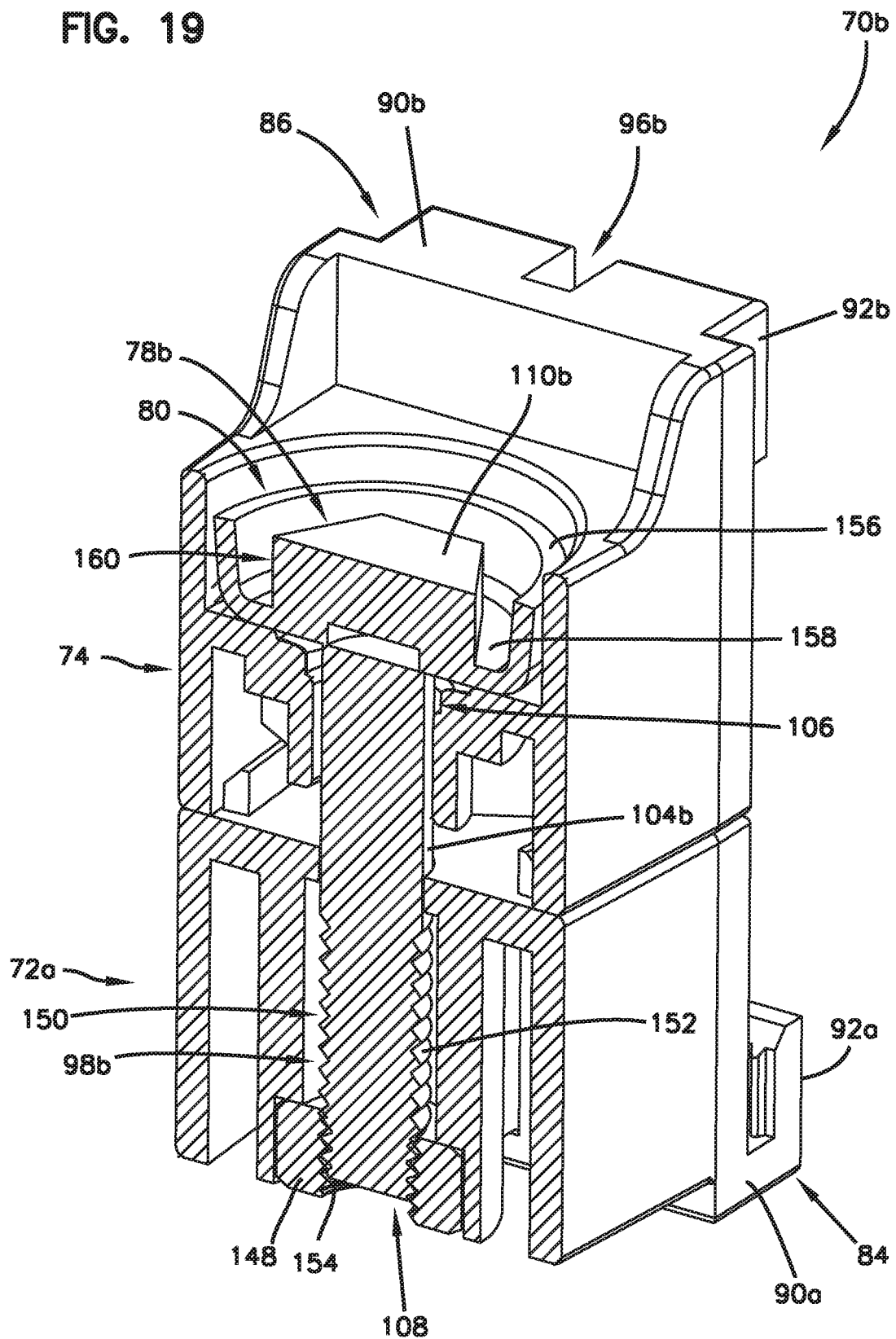
FIG. 19 is a cross-section view of the modular locking device of FIG. 18.

Turning to FIGS. 18 and 19, another modular locking device 70b is shown with fastening system 98b that includes another example securing element 78b (e.g., screw, bolt) and a nut 148 that threadedly mates with the securing element 78b as described above with reference to the fastening system 98a. For the sake of brevity, only those portions of the securing element 78b that differ from the securing element 78a illustrated in FIGS. 16 and 17 will be described in detail.

The securing element 78b includes an elongated shank 104b having a first end 106 and a second end 108 opposite the first end 106, and a bolt head 110b positioned adjacent the first end 106. In one or more embodiments, the bolt head 110b can consist of any type of bolt head size and shape known in the art (e.g., hex head, carriage bolt head, truss head, fillister head, etc.). In the example depicted, the securing element 78b is a special security bolt (e.g., safety screw) with a hex head. Although the securing element 78b has a hex-shaped drive head; other drive head configurations may be employed. The bolt head 110b of the securing element 78b can include a washer 156 (e.g., rim, flange). In certain examples, the washer 156 may be integral with (e.g., formed in one seamless piece with) or coupled to, the bolt head 110b, although alternatives are possible. The bolt head 110b has a base 158 from which the washer 156 extends upwardly to be substantially perpendicular to the base 158. A gap 160 (e.g., clearance) would be produced between the washer 156 and the bolt head 110b for receiving a socket (not shown). The socket may be a special socket with thin walls for security and safety precautions to keep the modular locking device 70b from being tampered with. The shank 104b of the securing element 78b has a threaded portion 150 with external bolt threads 152. The nut 148 can have a plurality of internal nut threads 154. The nut threads 154 can be sized and shaped to threadedly engage the bolt threads 152 whereby when the nut threads 154 engage the bolt threads 152, the first and second locking members 72a, 74 are secured together on the enclosure 10. In certain examples, any type of appropriate washers can be used with the fastening system 98b, such as flat, square, locking, dock, fender, etc. (not shown in the Figures).

In certain examples, a securing element may be a padlock that can be used to couple the first and second locking members 72a, 74 together. In other examples, the securing element may include hooks, loops, a band, a strand, or a zip tie for coupling the first and second locking members 72a, 74 together.

From the forgoing detailed description, it will be evident that modifications and variations can be made without departing from the spirit and scope of the disclosure.

What is claimed is:

1. A telecommunications enclosure arrangement, comprising:
   (a) an enclosure having a base, and a cover connected to the base, the base and the cover cooperating to form a plurality of sidewalls and define an interior region, the cover being adapted for movement between an open position and a closed position;
   (b) a latch being disposed on at least one of the plurality of sidewalls of the enclosure for securing the base and the cover together in the closed position; and
   (c) a modular locking device being a separate, add-on feature adapted to be mounted to the enclosure to provide added security and limit access to the interior region of the enclosure, the modular locking device including:
      (i) a first locking member slidably mountable to the base of the enclosure such that a first external structure of the base is received in a first receptacle defined by the first locking member from a direction parallel to relative movement between the base and the cover during opening and closing of the enclosure; and
      (ii) a second locking member slidably mountable to the cover of the enclosure such that a second external structure of the base is received in a second receptacle defined by the second locking member from a direction parallel to relative movement between the base and the cover during opening and closing of the enclosure;
   (d) the first and second locking members each being a unitary molded plastic part, the first and second locking members defining respective first and second openings for receiving therein a securing element, the securing element being adapted to couple the first and second locking members together when the cover is in the closed position, wherein, in use, the securing element prevents the cover from moving from the closed position to the open position.

2. The telecommunications enclosure arrangement of claim 1, further comprising a plurality of spaced latches disposed on the at least one of the plurality of sidewalls of the enclosure.

3. The telecommunications enclosure arrangement of claim 2, wherein the modular locking device is adapted to be positioned between the spaced latches.

4. The telecommunications enclosure arrangement of claim 1, wherein the modular locking device is removably secured to the enclosure.

5. The telecommunications enclosure arrangement of claim 1, wherein the first locking member includes a first hook member having a first face plate, a first horizontal member extending in a transverse direction relative to the first face plate, and first leg members extending parallel to the first face plate to define a first hook receptacle that is adapted to receive structure on the base of the enclosure.

6. The telecommunications enclosure arrangement of claim 5, wherein the second locking member includes a second hook member having a second face plate, a second horizontal member extending in a transverse direction relative to the second face plate, and second leg members extending parallel to the second face plate to define a second hook receptacle that is adapted to receive structure on the cover of the enclosure.

7. The telecommunications enclosure arrangement of claim 6, wherein a cross-sectional area of the first and second hook members has a J-shape.

8. The telecommunications enclosure arrangement of claim 6, wherein, when the first and second locking members are mounted to the enclosure, the first and second hook receptacles face each other.

9. The telecommunications enclosure arrangement of claim 5, wherein the first face plate includes ribs extending outwardly therefrom for frictionally engaging the enclosure when the first locking member is mounted thereto.

10. The telecommunications enclosure arrangement of claim 5, wherein the first locking member includes retention members in the form of a flap.

11. The telecommunications enclosure arrangement of claim 10, wherein the retention members each have an edge configured to be received in corresponding grooves defined in the securing element.

12. The telecommunications enclosure arrangement of claim 1, further comprising a management unit that mounts within the interior region of the enclosure.

13. The telecommunications enclosure arrangement of claim 1, wherein the securing element is a padlock.

14. The telecommunications enclosure arrangement of claim 1, wherein the securing element is a hex-headed bolt.

15. The telecommunications enclosure arrangement of claim 1, wherein the securing element is a triangular-headed fastening lock.

16. The telecommunications enclosure arrangement of claim 1, wherein the securing element is a security bolt having a hex head and a washer.

17. The telecommunications enclosure arrangement of claim 16, wherein the hex head is integral with the washer.

18. The telecommunications enclosure arrangement of claim 1, wherein the first and second locking members are in a snap-fit engagement with the enclosure.

19. The telecommunications enclosure arrangement of claim 1, wherein the first and second locking members are attached to the enclosure with an adhesive.

20. The telecommunications enclosure arrangement of claim 1, further comprising two alignment members extending upwardly from a top surface of the first locking member, the two alignment members being adapted to prevent misalignment of the first and second locking members when coupled together.

21. A telecommunications enclosure arrangement, comprising:
   (a) an enclosure having a base, and a cover connected to the base, the base and the cover cooperating to form a plurality of sidewalls and define an interior region, the cover being adapted for movement between an open position and a closed position;
   (b) a modular locking device being a separate, add-on feature adapted to be mounted to the enclosure to provide added security and limit access to the interior region of the enclosure, the modular locking device including:
      (i) a first locking member slidably mountable to the base of the enclosure such that a first external structure of the base is received in a first receptacle defined by the first locking member from a direction parallel to relative movement between the base and the cover during opening and closing of the enclosure; and
      (ii) a second locking member slidably mountable to the cover of the enclosure such that a second external structure of the base is received in a second receptacle defined by the second locking member from a direction parallel to relative movement between the base and the cover during opening and closing of the enclosure;

(c) the first and second locking members each being a unitary molded plastic part, the first and second locking members defining respective first and second openings for receiving therein a securing element, the securing element being adapted to couple the first and second locking members together when the cover is in the closed position, wherein, in use, the securing element prevents the cover from moving from the closed position to the open position.

22. A telecommunications enclosure arrangement, comprising:
   (a) an enclosure having a base, and a cover connected to the base, the base and the cover cooperating to form a plurality of sidewalls and define an interior region, the cover being adapted for movement between an open position and a closed position;
   (b) a modular locking device being a separate, add-on feature adapted to be mounted to the enclosure by a snap-fit connection to provide added security and limit access to the interior region of the enclosure, the modular locking device including:
      (i) a first locking member mountable to the base of the enclosure such that a first external structure of the base is received in a first receptacle defined by the first locking member from a direction parallel to relative movement between the base and the cover during opening and closing of the enclosure; and
      (ii) a second locking member mountable to the cover of the enclosure such that a second external structure of the base is received in a second receptacle defined by the second locking member from a direction parallel to relative movement between the base and the cover during opening and closing of the enclosure;
   (c) the first and second locking members each being a unitary molded plastic part, the first and second locking members defining respective first and second openings for receiving therein a securing element, the securing element being adapted to couple the first and second locking members together when the cover is in the closed position, wherein, in use, the securing element prevents the cover from moving from the closed position to the open position.

* * * * *